(12) United States Patent
Kaji et al.

(10) Patent No.: US 8,742,537 B2
(45) Date of Patent: Jun. 3, 2014

(54) SEMICONDUCTOR DEVICE AND METHOD OF MANUFACTURING THE SAME

(71) Applicant: Lapis Semiconductor Co., Ltd., Yokohama (JP)

(72) Inventors: Takao Kaji, Miyazaki (JP); Katsuhito Sasaki, Miyazaki (JP); Takaaki Kodaira, Miyazaki (JP); Yuuki Doi, Miyazaki (JP); Minako Oritsu, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/910,145

(22) Filed: Jun. 5, 2013

(65) Prior Publication Data

US 2013/0334655 A1 Dec. 19, 2013

(30) Foreign Application Priority Data

Jun. 14, 2012 (JP) ................................ 2012-134998

(51) Int. Cl.
*H01L 21/70* (2006.01)
*H01L 29/06* (2006.01)

(52) U.S. Cl.
USPC ................... 257/510; 257/E27.013; 438/424

(58) Field of Classification Search
None
See application file for complete search history.

(56) References Cited

U.S. PATENT DOCUMENTS

| | | | | |
|---|---|---|---|---|
| 4,952,524 A | * | 8/1990 | Lee et al. | 438/437 |
| 5,448,102 A | * | 9/1995 | Gaul et al. | 257/510 |
| 6,127,720 A | * | 10/2000 | Nakura et al. | 257/509 |
| 6,828,646 B2 | * | 12/2004 | Marty et al. | 257/501 |
| 7,060,564 B1 | * | 6/2006 | Kang et al. | 438/266 |
| 7,968,418 B1 | * | 6/2011 | Labonte et al. | 438/359 |
| 8,461,015 B2 | * | 6/2013 | Huang et al. | 438/422 |
| 2008/0318392 A1 | * | 12/2008 | Hung et al. | 438/435 |
| 2011/0248357 A1 | * | 10/2011 | Kwon et al. | 257/392 |
| 2013/0334654 A1 | * | 12/2013 | Kaji et al. | 257/510 |

FOREIGN PATENT DOCUMENTS

| | | |
|---|---|---|
| JP | 2001-199191 | 7/2001 |
| JP | 2003-303830 | 10/2003 |
| JP | 2009-164609 | 7/2009 |

OTHER PUBLICATIONS

Xue, Jiying, Yangdong Deng, Zuochang Ye, Hongrui Wang, Liu Yang, and Zhiping Yu. "A Framework for Layout-Dependent STI Stress Analysis and Stress-Aware Circuit Optimization." IEEE Transactions on Very Large Scale Integration (VLSI) Systems 20.3 (2012): 498-511.*

* cited by examiner

*Primary Examiner* — Thomas L Dickey
*Assistant Examiner* — Joseph Schoenholtz
(74) *Attorney, Agent, or Firm* — Volentine & Whitt, PLLC

(57) ABSTRACT

Disclosed is a semiconductor device including: a semiconductor substrate; first and second element isolating trenches that are formed in one main surface of the semiconductor substrate separately from each other; a first insulating material that is formed within the first element isolating trench; a plurality of first element formation regions that are surrounded by the first element isolating trench; first semiconductor elements that are respectively formed in the first element formation regions; a second insulating material that is formed within the second element isolating trench; a second element formation region that is surrounded by the second element isolating trench; a second semiconductor element that is formed in the second element formation region; and a stress relaxation structure that is formed between the first element isolating trench and the second element isolating trench.

11 Claims, 14 Drawing Sheets

SEMICONDUCTOR DEVICE AND METHOD OF MANUFACTURING THE SAME

CROSS-REFERENCE TO RELATED APPLICATION

This application claims priority under 35 USC 119 from Japanese Patent Application No. 2012-134998 filed on Jun. 14, 2012, the disclosure of which is incorporated by reference herein.

BACKGROUND

1. Technical Field

The present invention relates to a semiconductor device and a method of manufacturing the same, and more particularly, relates to a semiconductor device including an element isolating trench structure and a method of manufacturing the same.

2. Related Art

Various semiconductor devices including element isolating trench structures are proposed (see Japanese Patent Application Laid-Open (JP-A) Nos. 2009-164609, 2003-303830 and 2001-199191).

The present inventors have found that there is the following problem as a result of intensively investigating the semiconductor devices including such element isolating trench structures. That is, when such an element isolating trench structure is arranged to be of two-dimensionally high density, it has been found that there is a problem in that a crack is generated in a trench adjacent to the trench structure which is high densely arranged.

SUMMARY

According to an aspect of the present invention, there is provided a semiconductor device including:

a semiconductor substrate;

first and second element isolating trenches that are formed in one main surface of the semiconductor substrate separately from each other;

a first insulating material that is formed within the first element isolating trench;

a plurality of first element formation regions that are surrounded by the first element isolating trench;

first semiconductor elements that are respectively formed in the first element formation regions;

a second insulating material that is formed within the second element isolating trench;

a second element formation region that is surrounded by the second element isolating trench;

a second semiconductor element that is formed in the second element formation region; and a stress relaxation structure that is formed between the first element isolating trench and the second element isolating trench.

According to another aspect of the present invention, there is provided a semiconductor device including:

a semiconductor substrate;

first and second element isolating trenches that are formed in one main surface of the semiconductor substrate separately from each other;

a first insulating material that is formed within the first element isolating trench;

a plurality of first element formation regions that are surrounded by the first element isolating trench;

first semiconductor elements that are respectively formed in the first element formation regions;

a second insulating material that is formed within the second element isolating trench;

a second element formation region that is surrounded by the second element isolating trench; and a second semiconductor element that is formed in the second element formation region, wherein the second element isolating trench includes a trench formed in the one main surface so as to be inclined at an angle of $\theta$ ($0°<\theta<90°$) with respect to a direction perpendicular to a direction toward the second element isolating trench from the first element isolating trench.

According to still another aspect of the present invention, there is provided a method of manufacturing a semiconductor device including:

forming a structure in one main surface of a semiconductor substrate, the structure including first and second element isolating trenches that are separated from each other, a first insulating material that is formed within the first element isolating trench, a plurality of first element formation regions that are surrounded by the first element isolating trench, a second insulating material that is formed within the second element isolating trench, a second element formation region that is surrounded by the second element isolating trench, and a stress relaxation structure that is formed between the first element isolating trench and the second element isolating trench; and thereafter forming first semiconductor elements in the first element formation regions respectively, and forming a second semiconductor element in the second element formation region.

BRIEF DESCRIPTION OF THE DRAWINGS

Exemplary embodiments of the present invention will be described in detail based on the following figures, wherein.

DETAILED DESCRIPTION OF THE INVENTION

Hereinafter, preferred embodiments of the present invention will be described with reference to the accompanying drawings.

Figure 1:
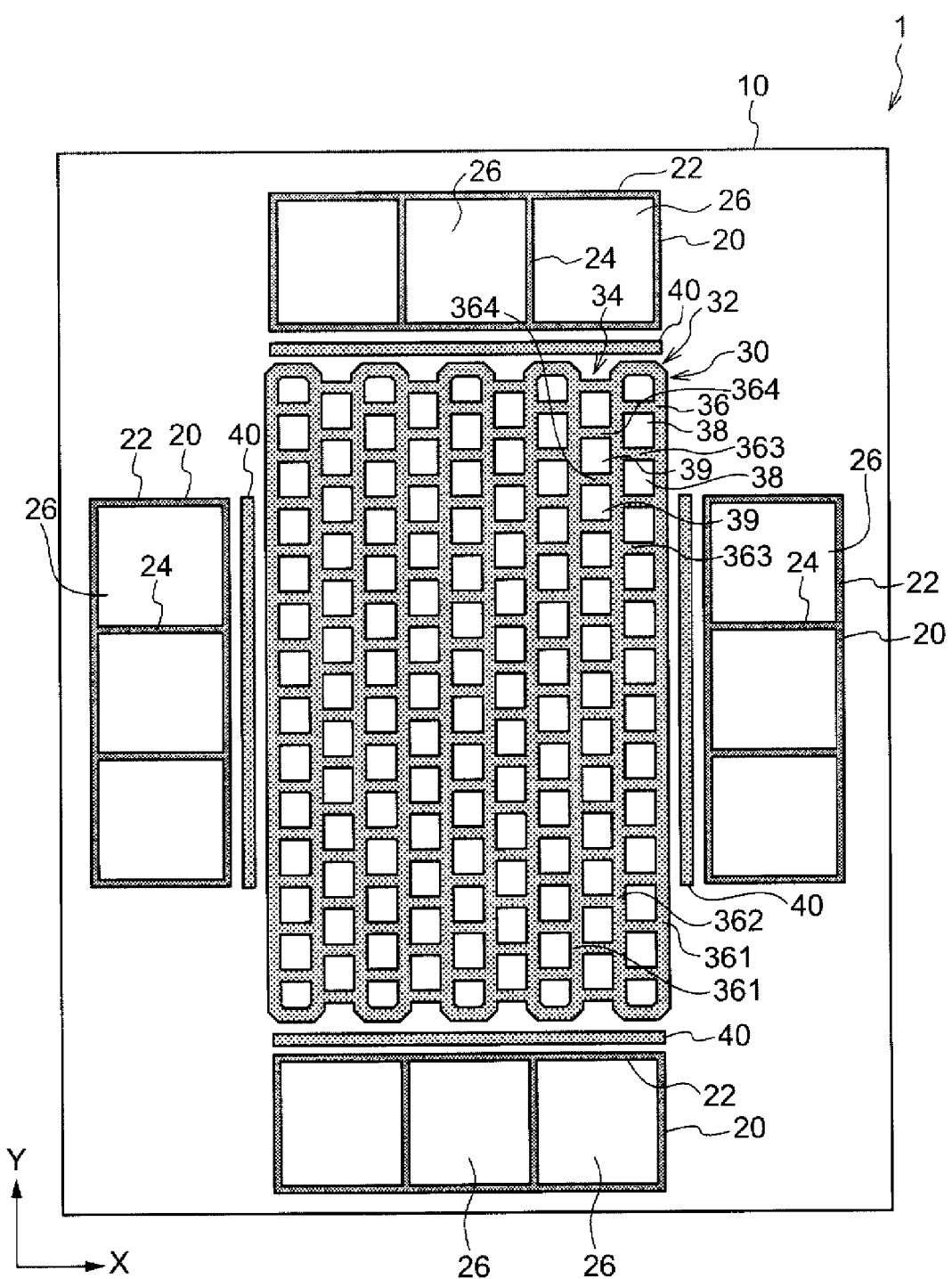
FIG. 1 is a schematic plan view for explaining semiconductor devices according to first to fourth embodiments of the present invention.

Referring to FIG. 1, in a semiconductor device 1 according to first to fourth preferred embodiments of the present invention, element isolating trench structures 20 for an I/O element are respectively provided at four sides of the peripheral portion of a semiconductor chip 10, and an element isolating trench structure 30 is provided in the central portion thereof. In the element isolating trench structure 20, a region surrounded by an element isolating trench 22 serves as an element formation region 26 for an I/O element. An element isolating trench 24 located between the element formation regions 26 adjacent to each other is shared by the element formation regions 26 adjacent to each other. The element isolating trench structure 20 is used for an I/O element, and thus the element formation region 26 is larger than the element formation region of the element isolating trench structure 30 located in the central portion.

Element formation regions 38 and 39 of the element isolating trench structure 30 located in the central portion are smaller than the element formation region 26 of the element isolating trench structure 20 for an I/O element, and the element formation regions 38 and 39 disposed collectively are densely packed. In the element isolating trench structure 30, an element isolating trench structure 32 and an element isolating trench structure 34 are alternately disposed.

An element isolating trench 36 of the element isolating trench structure 32 includes element isolating trenches 361 and 362 extending in a Y direction, and an element isolating trench 363 extending in an X direction. Meanwhile, the X direction and the Y direction are at a right angle to each other. A region surrounded by the element isolating trenches 361 and 362 and the element isolating trenches 363 and 363 serves as the element formation region 38. The element isolating trench 363 located between the element formation regions 38 adjacent to each other is shared by the element formation regions 38 adjacent to each other. In the element isolating trench structure 32, the element formation regions 38 are arranged parallel in a line in the Y direction.

The element isolating trench 36 of the element isolating trench structure 34 includes the element isolating trenches 361 and 362 extending in the Y direction, and an element isolating trench 364 extending in the X direction. A region surrounded by the element isolating trenches 361 and 362 and the element isolating trenches 364 and 364 serves as the element formation region 39. The element isolating trench 364 located between the element formation regions 39 adjacent to each other is shared by the element formation regions 39 adjacent to each other. In the element isolating trench structure 34, the element formation regions 39 are arranged parallel in a line in the Y direction. The element formation region 38 of the element isolating trench structure 32 and the element formation region 39 of the element isolating trench structure 34 share the element isolating trench 361 or the element isolating trench 362 located between the element formation region 38 and the element formation region 39. The element isolating trench 363 of the element isolating trench structure 32 and the element isolating trench 364 of the element isolating trench structure 34 are alternately disposed in the Y direction. The element isolating trench 363 and the element isolating trench 361 or the element isolating trench 362 intersect each other in a T-shape, and the element isolating trench 364 and the element isolating trench 361 or the element isolating trench 362 intersect each other in a T-shape. With such a structure having a T-shaped intersection, the embeddability of the element isolating trench in the intersection portion is better than that in a cross-shaped intersection portion.

Stress relaxation structures 40 are respectively provided between the element isolating trench structure 30 located in the central portion of the semiconductor chip 10 and the element isolating trench structures 20 for an I/O element disposed at four sides of the peripheral portion. In other words, places to which the element isolating trench structures 20 for an I/O element are opposite in the outer circumference of the element isolating trench structure 30 are provided with the stress relaxation structures 40 along the element isolating trench structure 30 and the element isolating trench structures 20 for an I/O element.

First Embodiment

Figure 2:
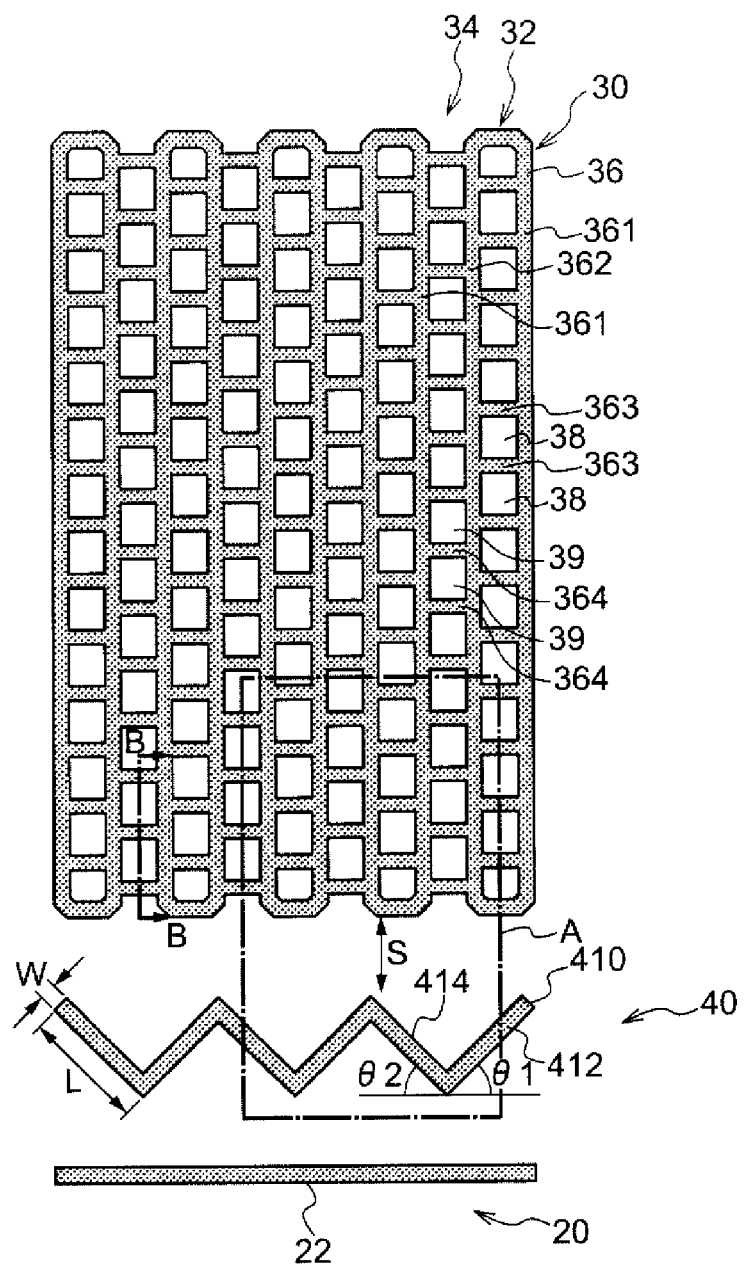
FIG. 2 is a schematic partially enlarged view of FIG. 1.

Referring to FIG. 2, in the present embodiment, a corrugated trench pattern structure 410 is provided as the stress relaxation structure 40 provided between the element isolating trench structure 30 and the element isolating trench structure 20. The corrugated trench pattern structure 410 includes a trench 412 inclined at an angle θ1 counterclockwise from the X direction, and a trench 414 inclined at an angle θ2 clockwise from the X direction. The relation of 0°<θ1<90° is established, and the relation of 0°<θ2<90° is established. The trench 412 and the trench 414 are disposed so as not to be horizontal nor perpendicular to the element isolating trenches 361, 362, 363, and 364 of the element isolating trench structure 30. Herein, θ1 and θ2 are preferably 45°. When these angles are 45°, stress (stress) may be uniformly dispersed in both the X direction and the Y direction. Each of the dimensions of the trench 412 and the trench 414 is preferably configured such that, for example, a width W in the short-side direction is approximately 1 μm, a width L in the long-side direction is equal to or more than 4 μm, a depth is equal to or more than 10 μm, and a distance S between the element isolating trench structure 30 and the trenches 412 and 414 is equal to or more than 2 μm.

Figure 4:
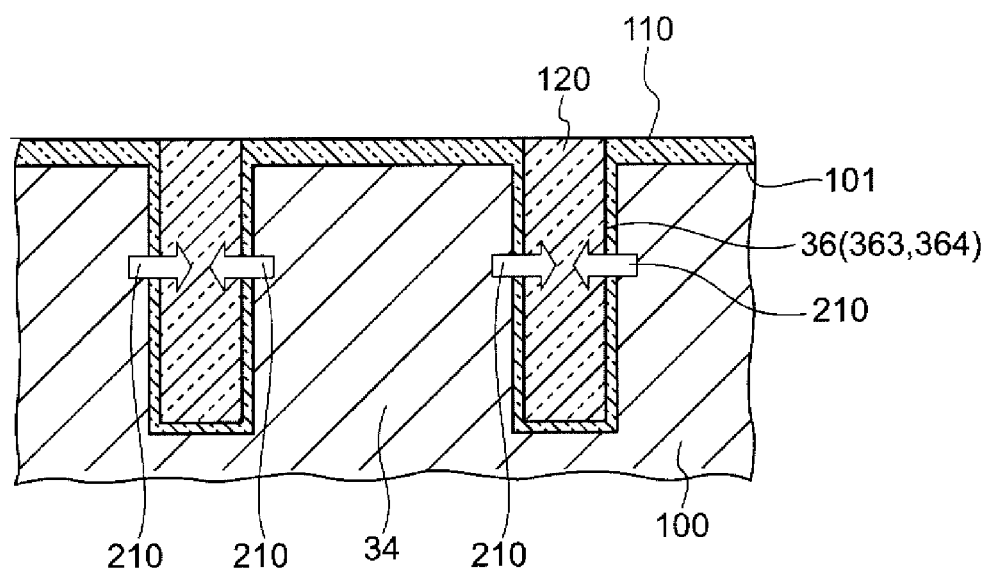
FIG. 4 is a schematic cross-sectional view taken along line BB of FIG. 2.

Referring to FIG. 4, the element isolating trench 36 is formed in one main surface 101 of a silicon substrate 100. The one main surface 101 of the silicon substrate 100 and the side face and the bottom face of the element isolating trench 36 are covered with a silicon oxide film 110 formed by thermal oxidation or the like. A silicon oxide film 120 embedded by a CVD method or the like is formed within the element isolating trench 36 covered with the silicon oxide film 110. After the silicon oxide film 120 is formed on the entirety of the surface by a CVD method or the like, the silicon oxide film 120 on the one main surface 101 of the silicon substrate 100 is removed by performing a planarization process. The dimensions of the element isolating trench 36 have, for example, a depth of equal to or more than 10 μm, a width of approximately 1 μm, and a distance between this element isolating trench 36 and the adjacent one of equal to or more than 2 μm. The dimensions are applicable to the element isolating trenches 361, 362, 363, and 364. Meanwhile, such a deep trench is used not only for a purpose of element isolation, but also for a purpose of dense disposition below a pad to reduce the capacity between the pad and the substrate. In addition, the trench 412 and the trench 414 of the stress relaxation structure 40 also include a similar structure. That is, the trenches 412 and 414 are formed on the one main surface 101 of the silicon substrate 100. The one main surface 101 of the silicon substrate 100 and the side faces and the bottom faces of the trenches 412 and 414 are covered with the silicon oxide film 110 formed by thermal oxidation or the like. The silicon oxide film 120 embedded by a CVD method or the like is formed within the trenches 412 and 414 covered with the silicon oxide film 110. Further, the element isolating trench structure 20 also includes a similar structure. That is, the element isolating trench 22 is formed in the one main surface 101 of the silicon substrate 100. The one main surface 101 of the silicon substrate 100 and the side face and the bottom face of the element isolating trench 22 are covered with the silicon oxide film 110 formed by thermal oxidation or the like. The silicon oxide film 120 embedded by a CVD method or the like is formed within the element isolating trench 22 covered with the silicon oxide film 110.

Figure 5:
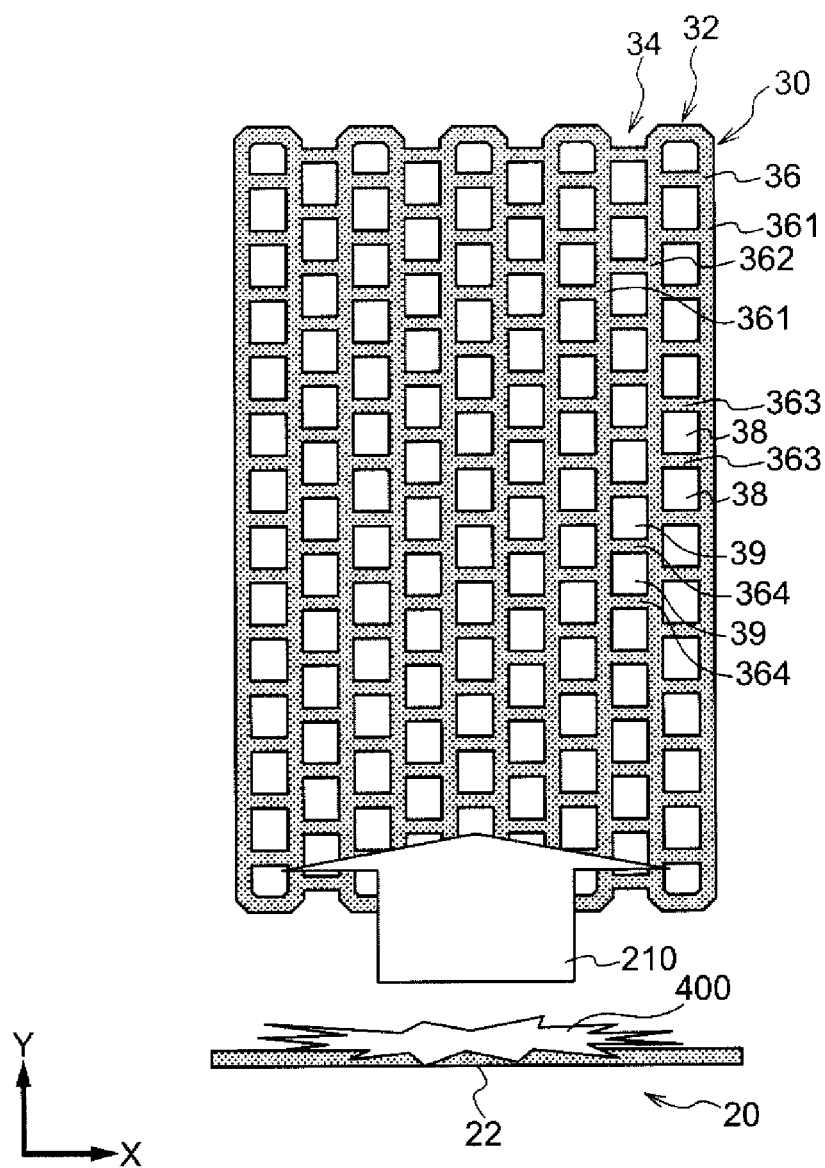
FIG. 5 is a schematic plan view for explaining a problem of a semiconductor device for comparison.

In the element isolating trench structure 30 in which the element formation regions 38 and 39 are densely packed and the element isolating trenches 36 (361, 362, 363, and 364) are densely disposed, the silicon oxide film 120 is contracted by heat treatment such as annealing, and thus the silicon substrate 110 receives stress 210 from the silicon oxide film 120. The influence of this stress becomes larger as the element isolating trenches 36 (361, 362, 363, and 364) are more densely packed. For this reason, as shown in FIG. 5, the stress reaches a peak at the outside of the element isolating trench structure 30, the stress 210 is concentrated on the element isolating trench 22 of the element isolating trench structure 20 adjacent to the element isolating trench structure 30, and thus a crack 400 is generated.

Figure 3:
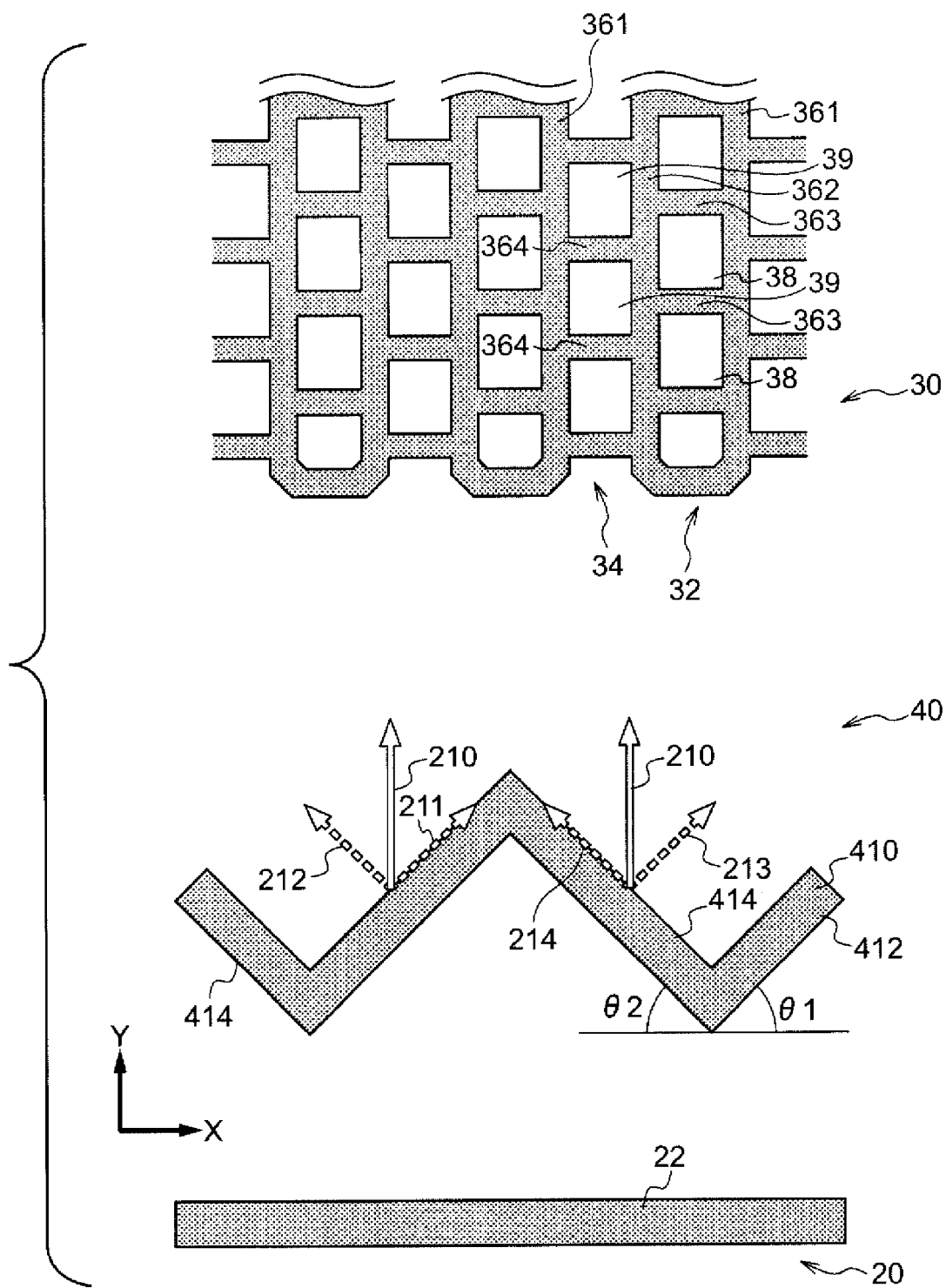
FIG. 3 is a schematic partially enlarged view of part A in FIG. 2.

Referring to FIG. 3, in the present embodiment, as mentioned above, the corrugated trench pattern structure 410 is provided as the stress relaxation structure 40 between the element isolating trench structure 30 and the element isolating trench structure 20. The corrugated trench pattern structure 410 includes the trench 412 inclined at an angle θ1 counterclockwise from the X direction, and the trench 414 inclined at an angle θ2 clockwise from the X direction. Therefore, the stress 210 received from the element isolating trench structure 30 by the element isolating trench structure 20 may be dispersed into a component 211 parallel to the trench 412 and a component 212 perpendicular thereto by the trench 412, and may be dispersed into a component 214 parallel to the trench 414 and a component 213 perpendicular thereto by the trench 414. For example, when θ1 and θ2 are 45°, the stresses 211 to 214 are approximately 0.7 times the stress 210. As a result, it is possible to prevent a crack from being generated in the element isolating trench structure 20 due to the stress caused by the element isolating trench structure 30.

Next, a method of manufacturing the semiconductor device 1 according to the present embodiment will be described. Referring to FIGS. 1 and 4, the element isolating trench 22, the element isolating trench 36 and the trenches 412 and 414 are first formed in one main surface 101 of the silicon substrate 100. Thereafter, the silicon oxide film 110 is formed by thermal oxidation or the like, on the one main surface 101 of the silicon substrate 100, the side face and the bottom face of the element isolating trench 22, the side face and the bottom face of the element isolating trench 36 and the side faces and the bottom faces of the trenches 412 and 414. Thereafter, the silicon oxide film 120 is formed on the entirety of the surface by a CVD method or the like. Thereafter, the silicon oxide film 120 on the one main surface 101 of the silicon substrate 100 is removed by performing a planarization process to form a structure in which the silicon oxide film 120 is embedded in the element isolating trench 22 covered with the silicon oxide film 110, the silicon oxide film 120 is embedded in the element isolating trench 36 covered with the silicon oxide film 110, and the silicon oxide film 120 is embedded in the trenches 412 and 414 covered with the silicon oxide film 110. Thereafter, a bipolar transistor, a MOS transistor or the like is formed in the element formation regions 38 and 39.

Second Embodiment

Figure 6:
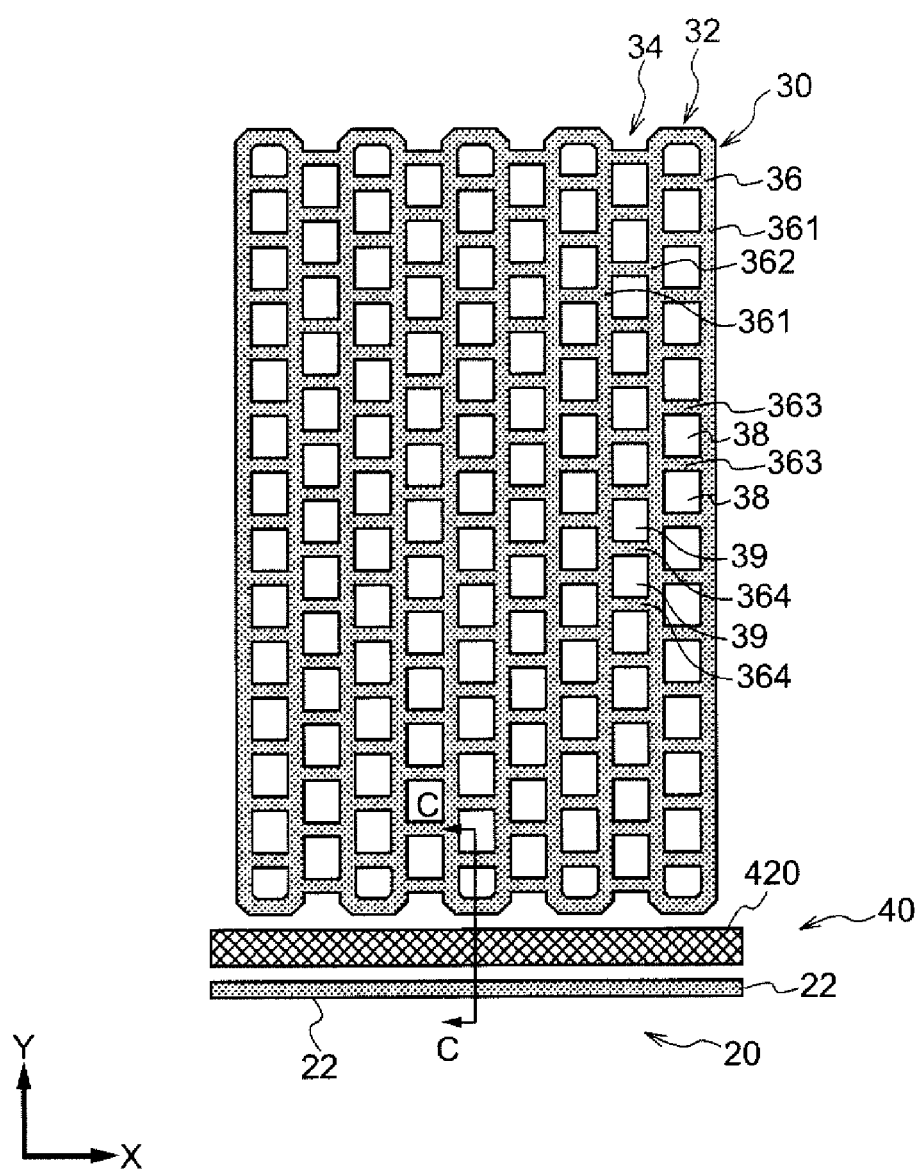
FIG. 6 is a schematic partially enlarged plan view for explaining the semiconductor device according to the second embodiment of the present invention.
Figure 7:
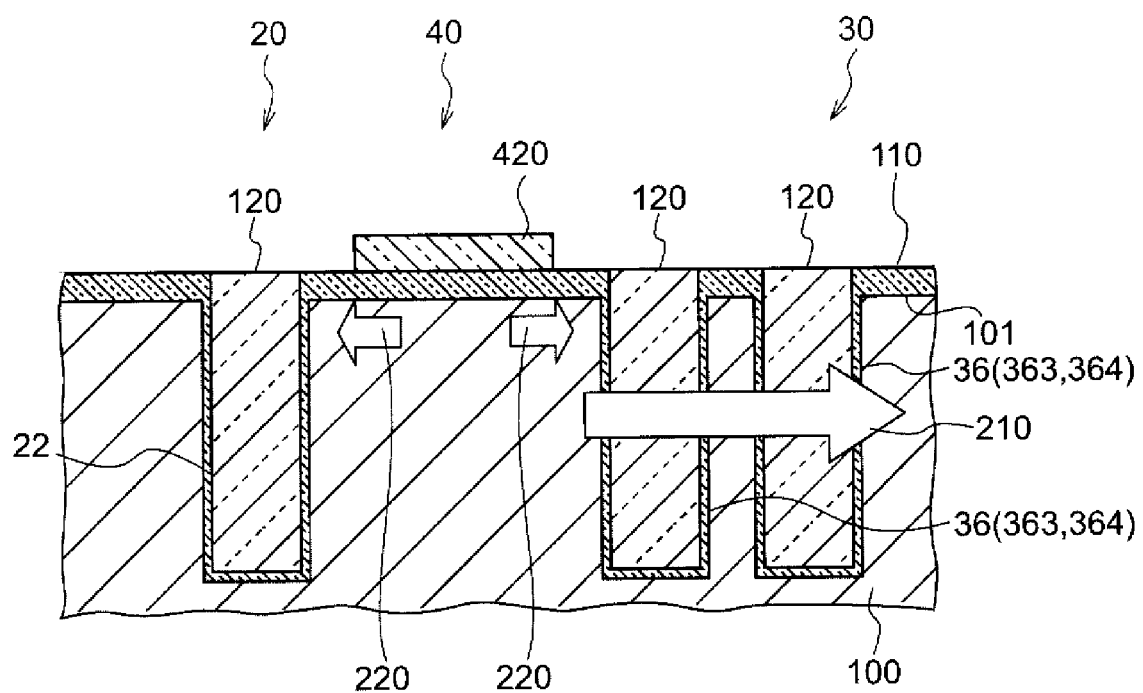
FIG. 7 is a schematic cross-sectional view taken along line CC of FIG. 6.

Referring to FIG. 6, in the present embodiment, a silicon nitride film 420 is provided as the stress relaxation structure 40 provided between the element isolating trench structure 30 and the element isolating trench structure 20. As shown in FIG. 7, the silicon nitride film 420 is an example of a compressive stress application structure in which stress 220 in a compression direction is applied to the silicon substrate 100. The silicon nitride film 420 is formed on the silicon oxide film 110 formed on the one main surface 101 of the silicon substrate 100 by thermal oxidation or the like. The silicon nitride film 420 is formed, using, for example, a CVD method, between the embedment of the element isolating trench 36 and heat treatment such as annealing. Preferably, the thickness of the silicon nitride film 420 is equal to or more than 1000 Å, the width is equal to or more than 1 μm, and the distance between the element isolating trench structure 30 and the element isolating trench structure 20 is equal to or less than 1 μm.

The silicon nitride film 420 that applies the stress 220 in a compression direction to the silicon substrate 100 is provided between the element isolating trench structure 30 and the element isolating trench structure 20, and thus the stress 220 in a compression direction is applied to the silicon substrate 100 by the silicon nitride film 420. Since this stress 220 acts as stress in a direction opposite to that of the stress 210 received from the element isolating trench structure 30 by the element isolating trench structure 20, the stress 210 received from the element isolating trench structure 30 by the element isolating trench structure 20 is relaxed by the stress 220, and thus a crack may be prevented from being generated.

Next, a method of manufacturing the semiconductor device 1 according to the present embodiment will be described. Referring to FIGS. 1, 6, and 7, the element isolating trench 22 and the element isolating trench 36 are first formed in one main surface 101 of the silicon substrate 100. Thereafter, the silicon oxide film 110 is formed by thermal oxidation or the like, on the one main surface 101 of the silicon substrate 100, the side face and the bottom face of the element isolating trench 22 and the side face and the bottom face of the element isolating trench 36. Thereafter, the silicon oxide film 120 is formed on the entirety of the surface by a CVD method or the like. Thereafter, the silicon oxide film 120 on the one main surface 101 of the silicon substrate 100 is removed by performing a planarization process to form a structure in which the silicon oxide film 120 is embedded in the element isolating trench 22 covered with the silicon oxide film 110, and the silicon oxide film 120 is embedded in the element isolating trench 36 covered with the silicon oxide film 110. Thereafter, a silicon nitride film is formed using, for example, a CVD method, and then is processed into a predetermined pattern to form the silicon nitride film 420. Thereafter, a bipolar transistor, MOS transistor or the like is formed in the element formation regions 38 and 39.

Third Embodiment

Figure 8:
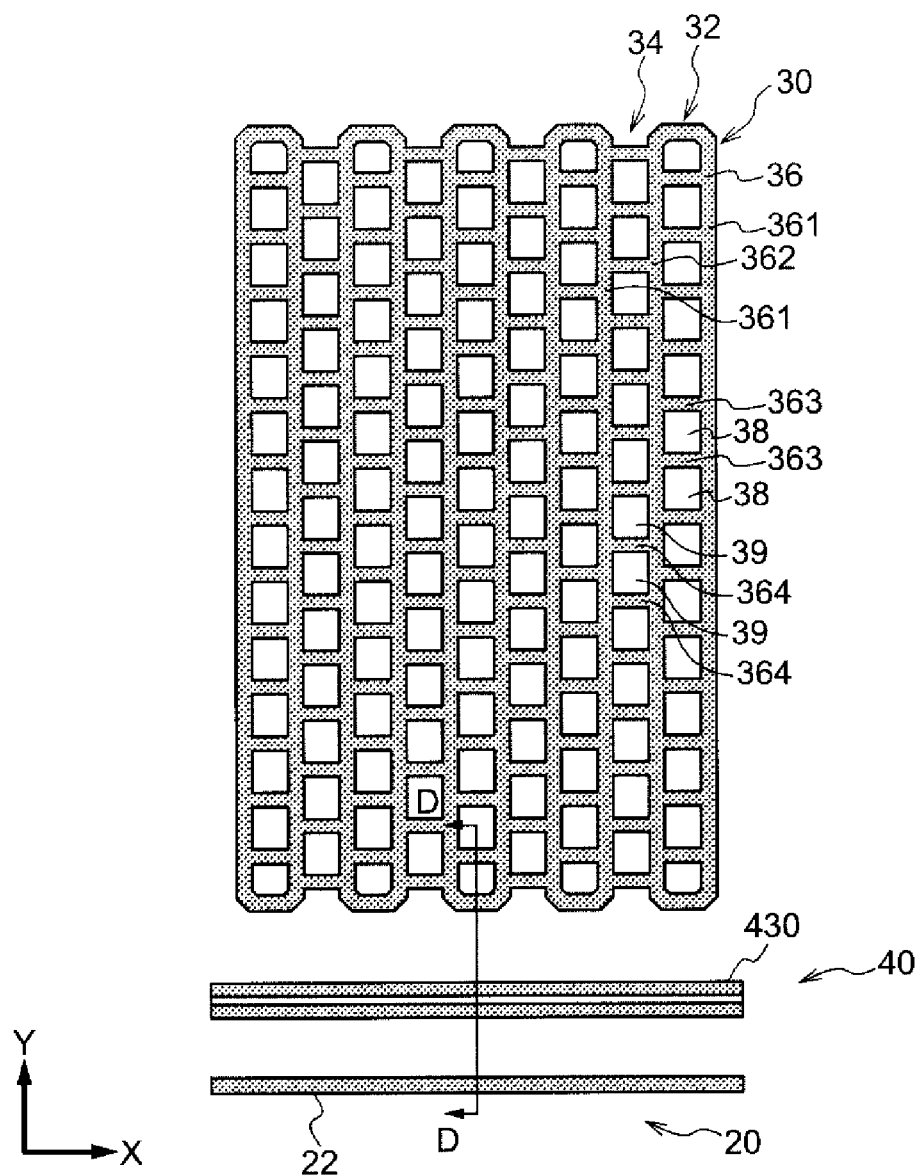
FIG. 8 is a schematic partially enlarged plan view for explaining the semiconductor device according to the third embodiment of the present invention.
Figure 9:
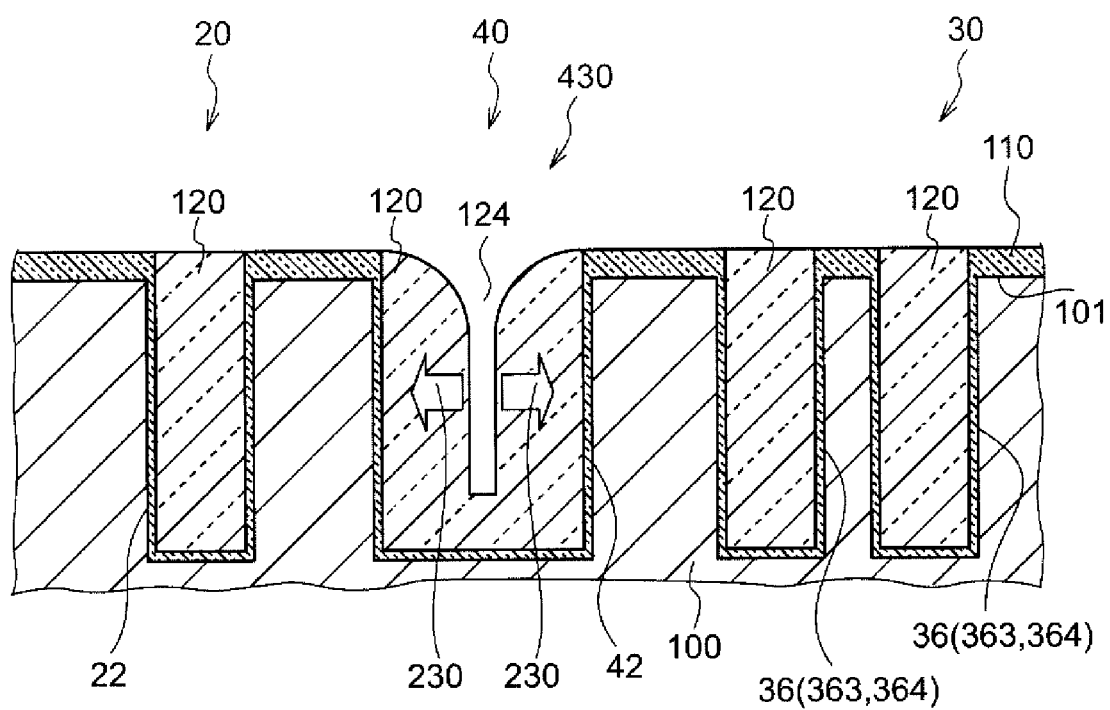
FIG. 9 is a schematic cross-sectional view taken along line DD of FIG. 8.

Referring to FIG. 8, in the present embodiment, a wide dummy trench structure 430 is provided as the stress relaxation structure 40 provided between the element isolating trench structure 30 and the element isolating trench structure 20. Referring to FIG. 9, a trench 42 is formed in one main surface 101 of the silicon substrate 100 located between the element isolating trench structure 30 and the element isolating trench structure 20. The one main surface 101 of the silicon substrate 100 and the side face and the bottom face of the trench 42 are covered with the silicon oxide film 110 formed by thermal oxidation or the like. The silicon oxide film 120 embedded by a CVD method or the like is formed within the trench 42 covered with the silicon oxide film 110. When the silicon oxide film 120 is formed under the conditions in which the silicon oxide film 120 is embedded in the element isolating trenches 36 (361, 362, 363, and 364) (see FIG. 4) covered with the silicon oxide film 110, the width of the trench 42 in the present embodiment is set to such a width that a gap 124 opened with a width of approximately 0.1 μm is formed in the silicon oxide film 120 within the trench 42.

Since the silicon oxide film 120 within the trench 42 includes the gap 124, the silicon oxide film 120 does not receive the stress 210 from the element isolating trench structure 30 resulting from the contraction of the silicon oxide film 120 within the element isolating trench structure 30 densely packed with the element isolating trenches 36 during heat treatment such as annealing, and does not also generate stress due to the contraction of the silicon oxide film 120 within the trench 42 in the direction of an arrow 230. Therefore, the element isolating trench structure 20 does not receive stress, and thus a crack may be prevented from being generated in the element isolating trench structure 20. In addition, the trench 42 may be formed simultaneously with the element isolating trench 36 of the element isolating trench structure 30 and the element isolating trench 22 of the element isolating trench structure 20, the silicon oxide film 110 within the trench 42 may be formed simultaneously with the silicon oxide film 110 within the element isolating trench 36 and the silicon oxide film 110 within the element isolating trench 22, and the silicon oxide film 120 within the trench 42 may be formed simultaneously with the silicon oxide film 120 within the element isolating trench 36 and the silicon oxide film 120 within the element isolating trench 22. Therefore, there is an advantage of being capable of forming the wide dummy trench structure 430 without adding a process. Meanwhile, the gap 124 is embedded with polycrystalline silicon, or an opening of the gap 124 is blocked up, for example, at the time of the formation of gate polycrystalline silicon, before a wiring process, in other words, after stress relaxation, and thus there is no influence at the time of the formation of wiring due to a step difference based on the gap 124. That is, the element isolating trench 36 is embedded with different materials such as polycrystalline silicon and the silicon oxide film.

Next, a method of manufacturing the semiconductor device 1 according to the present embodiment will be described. Referring to FIGS. 1, 8, and 9, the element isolating trench 22, the element isolating trench 36 and the trench 42 are first formed in the one main surface 101 of the silicon substrate 100. Thereafter, the silicon oxide film 110 is formed by thermal oxidation or the like, on the one main surface 101 of the silicon substrate 100, the side face and the bottom face of the element isolating trench 22, the side face and the bottom face of the element isolating trench 36 and the side face and the bottom face of the trench 42. Thereafter, the silicon oxide film 120 is formed on the entirety of the surface by a CVD method or the like. Thereafter, the silicon oxide film 120 on the one main surface 101 of the silicon substrate 100 is removed by performing a planarization process to form a structure in which the silicon oxide film 120 is embedded in the element isolating trench 22 covered with the silicon oxide film 110, the silicon oxide film 120 is embedded in the element isolating trench 36 covered with the silicon oxide film 110, and the silicon oxide film 120 is embedded in the trench 42 covered with the silicon oxide film 110. At this time, the trench 42 has a larger width than those of the element isolating trench 36 and the element isolating trench 22, and the gap 124 is formed in the silicon oxide film 120 within the trench 42. Thereafter, a bipolar transistor, a MOS transistor or the like is formed in the element formation regions 38 and 39. Taking an example of a case where a MOS transistor is formed, at the time of the formation of gate polycrystalline silicon, the gap 124 is embedded with polycrystalline silicon, or an opening of the gap 124 is blocked up by polycrystalline silicon.

Fourth Embodiment

Figure 10:
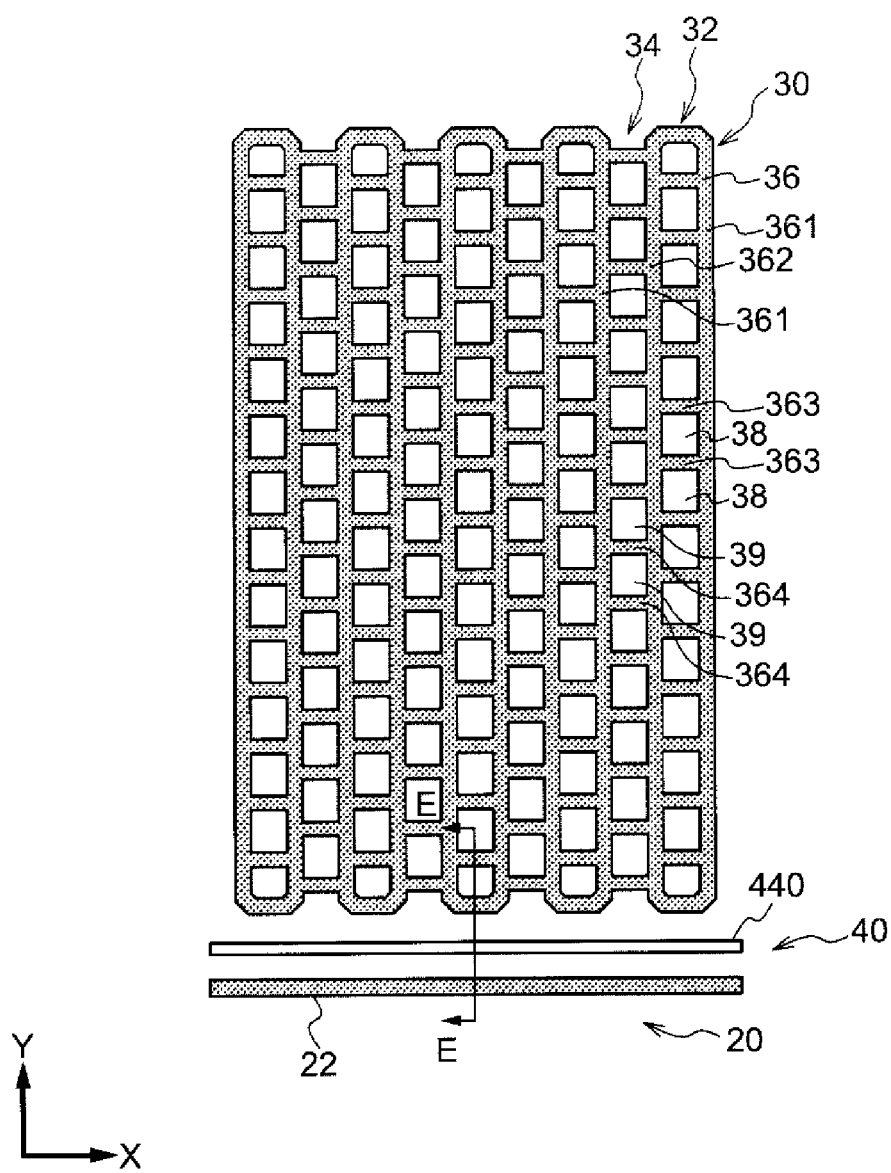
FIG. 10 is a schematic partially enlarged plan view for explaining the semiconductor device according the fourth embodiment of the present invention.
Figure 11:
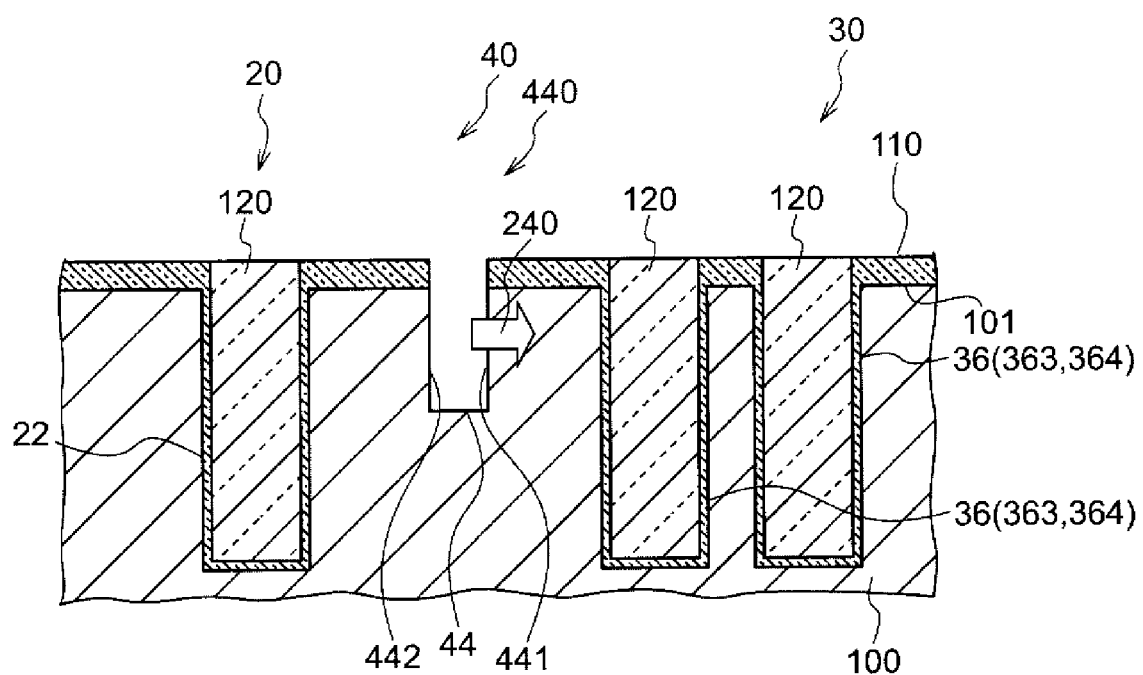
FIG. 11 is a schematic cross-sectional view taken along line EE of FIG. 10.

Referring to FIG. 10, in the present embodiment, a dummy trench structure 440 is provided as the stress relaxation structure 40 provided between the element isolating trench structure 30 and the element isolating trench structure 20. Referring to FIG. 11, a trench 44 is formed in one main surface 101 of the silicon substrate 100 located between the element isolating trench structure 30 and the element isolating trench structure 20. The silicon oxide film 110 is formed on the one main surface 101 of the silicon substrate 100, and within the element isolating trench 36 of the element isolating trench structure 30 and the element isolating trench 22 of the element isolating trench structure 20, and the silicon oxide film 120 is embedded in the element isolating trench 36 and the element isolating trench 22. However, the silicon oxide film 110 and the silicon oxide film 120 are not formed within the trench 44. The inside of the trench 44 becomes void. The trench 44 is formed by photolithography and anisotropic etching after the silicon oxide film 110 is formed within the element isolating trench 36 and the element isolating trench 22 and the element isolating trench 36 and the element isolating trench 22 are embedded with the silicon oxide film 120 and before heat treatment such as annealing. The depth of the trench 44 is about half the depths of the element isolating trench 36 and the element isolating trench 22, and the width of the trench 44 is set to such a width that the trench 44 is sufficiently embedded or an opening of the trench 44 is sufficiently blocked up by a process after the heat treatment such as annealing (for example, process of embedding polycrystalline silicon at the time of the formation of gate polycrystalline silicon). For this reason, there is no influence at the time of the formation of wiring due to a step difference.

The side face 441 of the trench 44 on the element isolating trench structure 30 side receives stress 240 from the element isolating trench structure 30 resulting from the contraction of the silicon oxide film 120 within the element isolating trench 36 during heat treatment such as annealing, but the side face 442 of the trench 44 on the element isolating trench structure 20 side does not receive stress from the element isolating trench structure 30. Therefore, the stress from the element isolating trench structure 30 is not applied to the element isolating trench structure 20.

Next, a method of manufacturing the semiconductor device 1 according to the present embodiment will be described. Referring to FIGS. 1, 10, and 11, the element isolating trench 22 and the element isolating trench 36 are first formed in the one main surface 101 of the silicon substrate 100. Thereafter, the silicon oxide film 110 is formed by thermal oxidation or the like, on the one main surface 101 of the silicon substrate 100, the side face and the bottom face of the element isolating trench 22 and the side face and the bottom face of the element isolating trench 36. Thereafter, the silicon oxide film 120 is formed on the entirety of the surface by a CVD method or the like. Thereafter the silicon oxide film 120 on the one main surface 101 of the silicon substrate 100 is removed by performing a planarization process to form a structure in which the silicon oxide film 120 is embedded in the element isolating trench 22 covered with the silicon oxide film 110, and the silicon oxide film 120 is embedded in the element isolating trench 36 covered with the silicon oxide film 110. Thereafter, the trench 44 is formed by photolithography and anisotropic etching. Thereafter, a bipolar transistor, a MOS transistor or the like is formed in the element formation regions 38 and 39. Taking an example of a case where a MOS transistor is formed, at the time of the formation of gate polycrystalline silicon, the trench 44 is embedded with polycrystalline silicon, or an opening of the trench 44 is blocked up by polycrystalline silicon.

Fifth Embodiment

Figure 12:
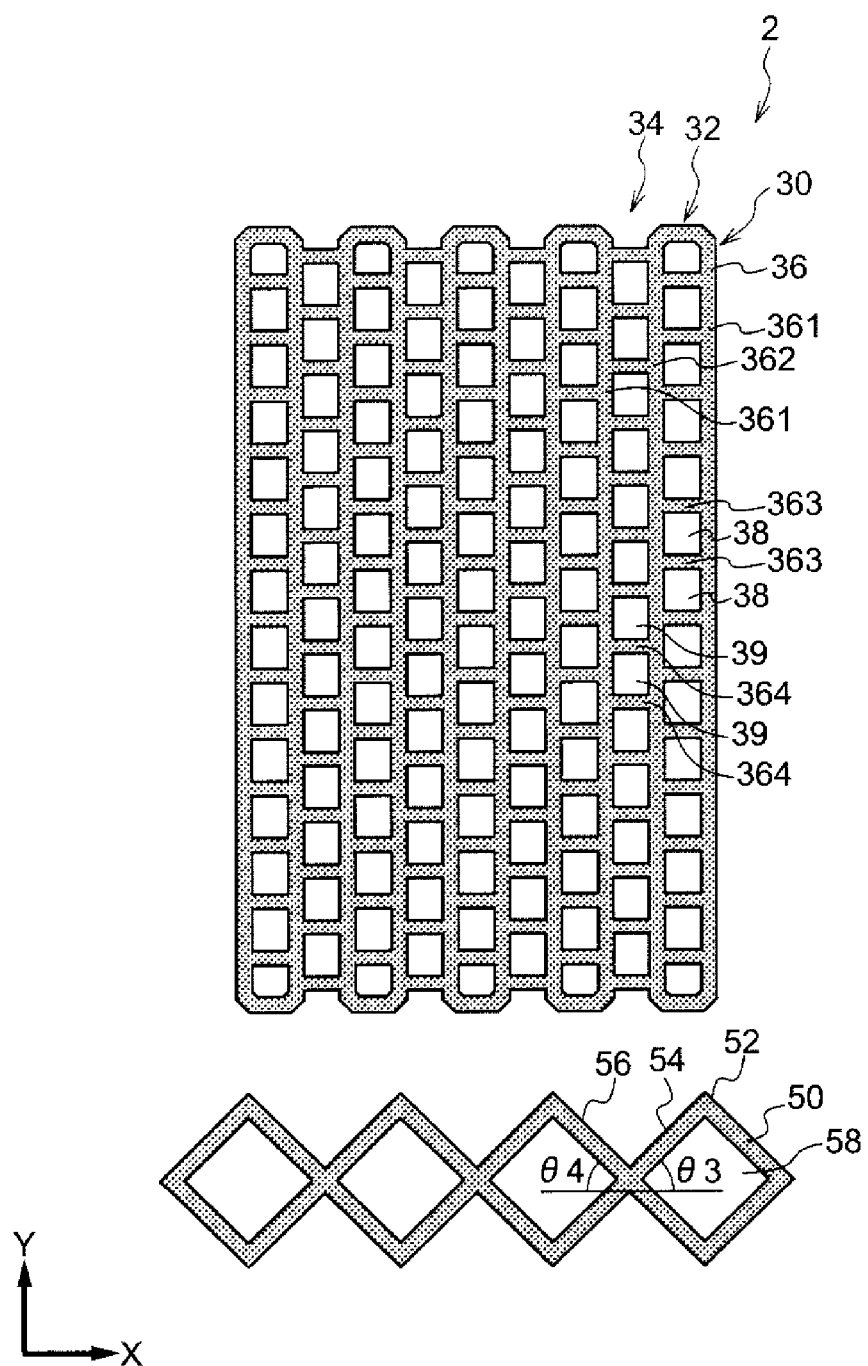
FIG. 12 is a schematic partially enlarged plan view for explaining a semiconductor device according to a fifth embodiment of the present invention.

Referring to FIG. 12, a semiconductor device 2 according to a fifth preferable embodiment of the present invention includes an element isolating trench structure 30 and an element isolating trench structure 50 for an I/O element. The element isolating trench structure 30 is the same as that in the first embodiment, and thus the description thereof will be omitted. In the element isolating trench structure 50, a region surrounded by an element isolating trench 52 serves as an element formation region 58 for an I/O element. The element isolating trench structure 50 is used for an I/O element, and thus the element formation region 58 is larger than the element formation regions 38 and 39 of the element isolating trench structure 30 located in the central portion. The element isolating trench 52 includes a trench 54 and a trench 56 which are at right angles to each other. The trench 54 is inclined at an angle θ3 counterclockwise from the X direction, and the trench 54 is inclined at an angle θ4 clockwise from the X direction. The relation of 0°<θ3<90° is established, and the relation of 0°<θ4<90° is established. Herein, θ3 and θ4 are preferably 45°. When these angles are 45°, stress may be uniformly dispersed in both the X direction and the Y direction.

In this manner, the element isolating trench 52 includes the trench 54 inclined at the angle θ3 counterclockwise from the X direction and the trench 56 inclined at the angle θ4 clockwise from the X direction. Therefore, stress received from the element isolating trench structure 30 by the element isolating trench structure 50 may be dispersed into a component parallel to the trench 54 and a component perpendicular thereto by the trench 54, and may be dispersed into a component parallel to the trench 56 and a component perpendicular thereto by the trench 56. For example, when θ3 and θ4 are 45°, the stress in the Y direction which is received from the element isolating trench structure 30 by the element isolating trench structure 50 may be decreased as much as approximately 0.7 times. As a result, a crack may be prevented from being generated in the element isolating trench structure 50 due to the stress caused by the element isolating trench structure 30.

Meanwhile, the element isolating trench 52 is formed in one main surface of the silicon substrate. The side face and the bottom face of the element isolating trench 52 are covered with a silicon oxide film formed by thermal oxidation or the like, and a silicon oxide film embedded by a CVD method or the like is formed within the element isolating trench 52 covered with the silicon oxide film 110 formed by the thermal oxidation or the like.

Next, a method of manufacturing the semiconductor device 2 according to the present embodiment will be described. Referring to FIG. 12, the element isolating trench 36 and the element isolating trench 52 are first formed in the one main surface of the silicon substrate. Thereafter, a silicon oxide film is formed by thermal oxidation or the like, on the one main surface of the silicon substrate, the side face and the bottom face of the element isolating trench 36 and the side face and the bottom face of the element isolating trench 22. Thereafter, a silicon oxide film is formed on the entirety of the surface by a CVD method or the like. Thereafter, the silicon oxide film formed on the one main surface of the silicon substrate by a CVD method or the like is removed by performing a planarization process to form a structure in which the silicon oxide film formed by the CVD method or the like is embedded in the element isolating trench 36 covered with the silicon oxide film formed by thermal oxidation or the like, and the silicon oxide film formed by the CVD method or the like is embedded in the element isolating trench 52 covered with the silicon oxide film formed by thermal oxidation or the like. Thereafter, a bipolar transistor, a MOS transistor or the like is formed in the element formation regions 38 and 39, and a semiconductor element for I/O is formed in the element formation region 58.

In the above-mentioned first to fifth embodiments, a bipolar transistor or a MOS transistor is formed in the element formation regions 38 and 39. Though a description is made by taking an example of the element formation region 38, the same is true of the element formation region 39.

Figure 13:
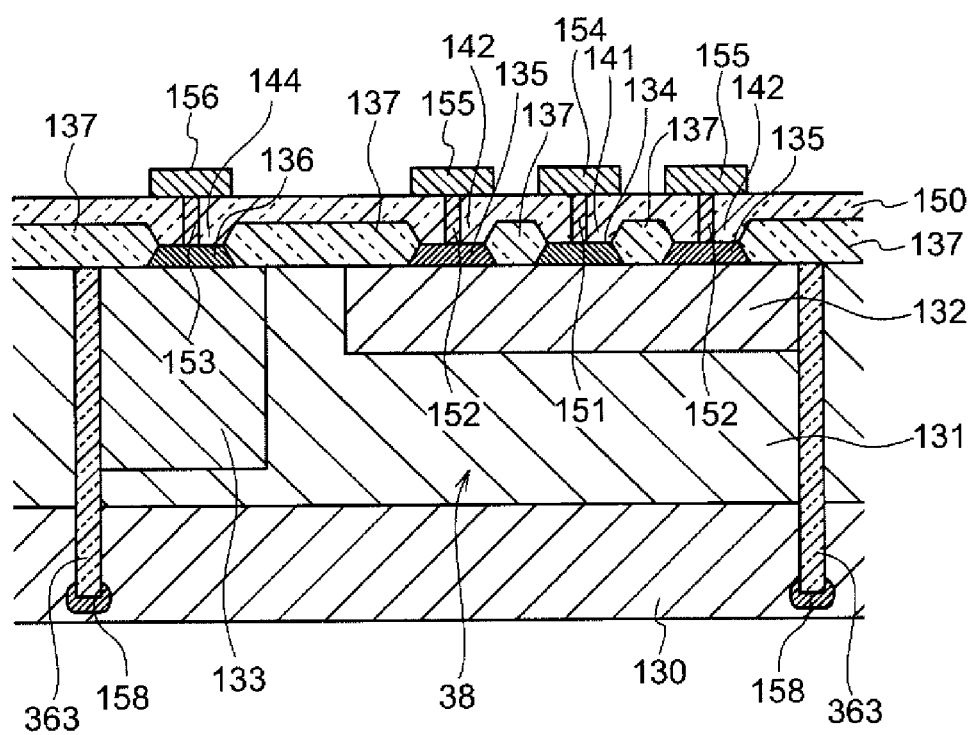
FIG. 13 is a schematic cross-sectional view for explaining a bipolar transistor which is preferably formed in an element formation region in the semiconductor devices according to the first to fourth embodiments of the present invention.

Referring to FIG. 13, $P^-$ layer 131 is formed on an $N^-$ substrate 130. An element isolating trench 363 is formed from the surface of the $P^-$ layer 131 up to the middle of the $N^-$ substrate 130. A channel stopper 158 is formed in the $N^-$ substrate 130 below the element isolating trench 363. A region surrounded by the element isolating trenches 363 and 363 and the element isolating trenches 361 and 362 (see FIGS. 2 and 8) serves as the element formation region 38. An $N^-$ layer 132 is formed in the surface of the $P^-$ layer 131. A $P^-$ layer 133 is formed in the $P^-$ layer 131 separately from the $N^-$ layer 132. A Locos oxide film 137 is formed on the surface of the $P^-$ layer 131. Openings 141, 142, and 144 are formed in the Locos oxide film 137. A $P^+$ layer 134 is formed on the $N^-$ layer 132 exposed to the opening 141. An $N^+$ layer 135 is formed on the $N^-$ layer 132 exposed to the opening 142. A $P^+$ layer 136 is formed on the $P^-$ layer 133 exposed to the opening 144. The $P^+$ layer 134 functions as an emitter. The $N^-$ layer 132 and the $N^+$ layer 135 function as a base. The $P^-$ layer 133 and the $P^+$ layer 136 function as a collector. An interlayer dielectric film 150 is formed on the Locos oxide film 137, the $P^+$ layer 134, the $N^+$ layer 135 and the $P^+$ layer 136. Contacts 151, 152, and 153 which are respectively connected to the $P^+$ layer 134, the $N^+$ layer 135 and the $P^+$ layer 136 are formed in through holes provided in the interlayer dielectric film 150. Metal wirings 154, 155, and 156 which are respectively connected to the contacts 151, 152, and 153 are formed on the interlayer dielectric film 150.

Figure 14:
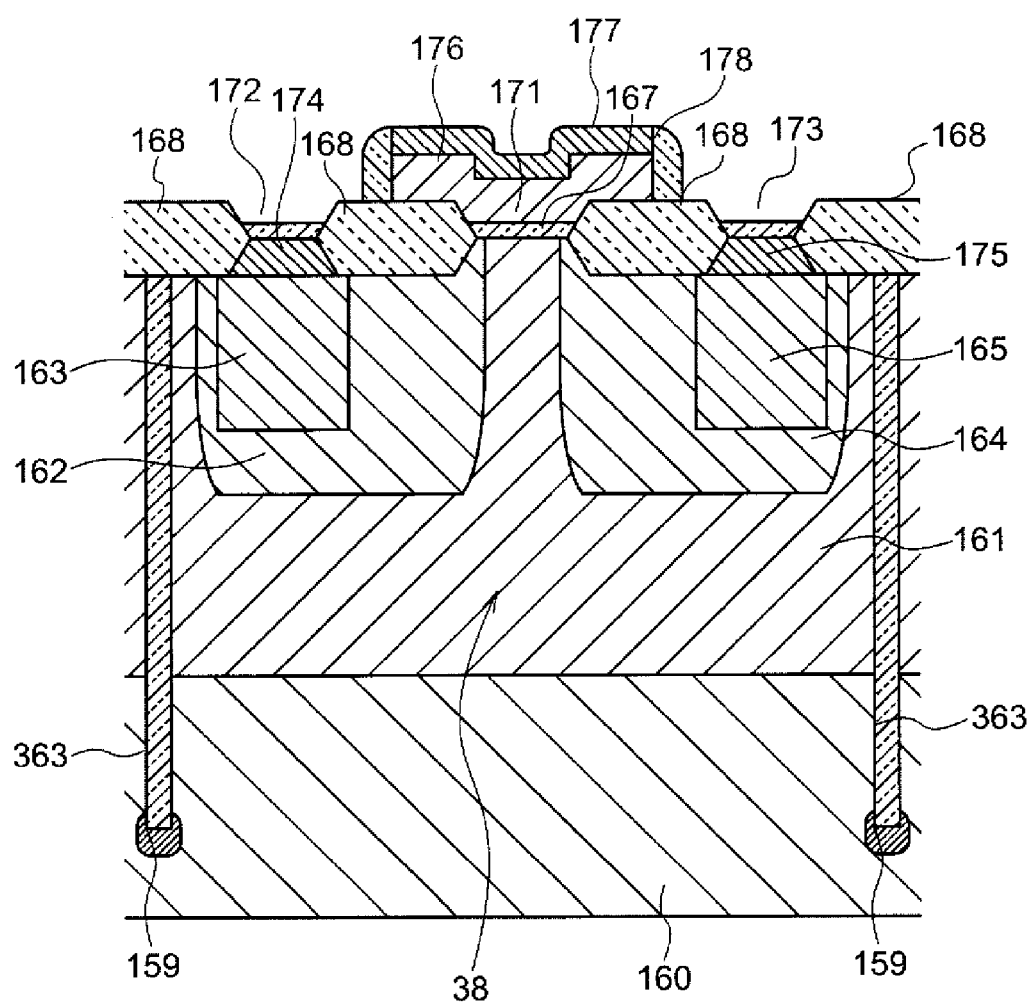
FIG. 14 is a schematic cross-sectional view for explaining a MOS transistor which is preferably formed in the element formation region in the semiconductor devices according to the first to fifth embodiments of the present invention.

Referring to FIG. 14, an N⁻ layer 161 is formed on a P⁻ substrate 160. An element isolating trench 363 is formed from the surface of the N⁻ layer 161 up to the middle of the P''' substrate 160. A channel stopper 159 is formed in the N⁻ substrate 130 below the element isolating trench 363. A region surrounded by the element isolating trenches 363 and 363 and the element isolating trenches 361 and 362 (see FIGS. 2 and 8) serves as the element formation region 38. P⁻ layers 162 and 163 are formed in the surface of the N⁻ layer 161 separately from each other. A P layer 163 is formed in the layer 162. A P⁻ layer 165 is formed in a P⁻ layer 164. A Locos oxide film 168 is formed on the surface of the N⁻ layer 161. Openings 171, 172, and 173 are formed in the Locos oxide film 168. A gate oxide film 167 is formed on the N⁻ layer 161 exposed to the opening 171. A P⁺ layer 174 is formed on the P layer 163 exposed to the opening 172. A P⁺ layer 175 is formed on the P layer 165 exposed to the opening 173. The P⁻ layer 162, the P layer 163 and the P⁺ layer 174 function as a source. The P⁻ layer 164, the P layer 165 and the P⁺ layer 175 function as a drain. A polycrystalline silicon layer 176 for a gate electrode is formed on the gate oxide film 167, a WSi 177 is formed on the polycrystalline silicon layer 176, and a sidewall 178 is formed on the side faces of the polycrystalline silicon layer 176 and the WSi 177.

As stated above, a variety of typical embodiments of the present invention have been described, but the present invention is not limited to these embodiments. Therefore, the scope of the present invention is intended to be limited only by the following claims.

What is claimed is:

1. A semiconductor device comprising:
   a semiconductor substrate;
   first and second element isolating trenches that are formed in one main surface of the semiconductor substrate separately from each other;
   a first insulating material that is formed within the first element isolating trench;
   a plurality of first element formation regions that are surrounded by the first element isolating trench;
   first semiconductor elements that are respectively formed in the first element formation regions;
   a second insulating material that is formed within the second element isolating trench;
   a second element formation region that is surrounded by the second element isolating trench;
   a second semiconductor element that is formed in the second element formation region; and
   a stress relaxation structure that is formed between the first element isolating trench and the second element isolating trench.

2. The semiconductor device according to claim 1, wherein the stress relaxation structure includes a trench formed in the one main surface so as to be inclined at an angle θ (0°<θ<90°) with respect to the first element isolating trench.

3. The semiconductor device according to claim 1, wherein the stress relaxation structure includes a material that applies stress in a direction opposite to that of stress applied by the first insulating material to the semiconductor substrate.

4. The semiconductor device according to claim 1, wherein the stress relaxation structure includes a trench formed in the one main surface of the semiconductor substrate and a third insulating material formed within the trench, and a gap is formed in the third insulating material.

5. The semiconductor device according to claim 1, wherein the stress relaxation structure includes a trench that is formed in the one main surface of the semiconductor substrate and that includes a void therein.

6. A semiconductor device comprising:
   a semiconductor substrate;
   first and second element isolating trenches that are formed in one main surface of the semiconductor substrate separately from each other;
   a first insulating material that is formed within the first element isolating trench;
   a plurality of first element formation regions that are surrounded by the first element isolating trench;
   first semiconductor elements that are respectively formed in the first element formation regions;
   a second insulating material that is formed within the second element isolating trench;
   a second element formation region that is surrounded by the second element isolating trench; and
   a second semiconductor element that is formed in the second element formation region,
   wherein the second element isolating trench includes a trench formed in the one main surface so as to be inclined at an angle of θ(0°<θ<90°) with respect to a direction perpendicular to a direction toward the second element isolating trench from the first element isolating trench.

7. A method of manufacturing a semiconductor device comprising:
   forming a structure in one main surface of a semiconductor substrate, the structure including first and second element isolating trenches that are separated from each other, a first insulating material that is formed within the first element isolating trench, a plurality of first element formation regions that are surrounded by the first element isolating trench, a second insulating material that is formed within the second element isolating trench, a second element formation region that is surrounded by the second element isolating trench, and a stress relaxation structure that is formed between the first element isolating trench and the second element isolating trench; and
   thereafter forming first semiconductor elements in the first element formation regions respectively, and forming a second semiconductor element in the second element formation region.

8. The method according to claim 7, wherein the stress relaxation structure includes a trench formed in the one main surface so as to be inclined at an angle θ(0°<θ<90° with respect to the first element isolating trench.

9. The method according to claim 7, wherein the stress relaxation structure includes a material that applies stress in a direction opposite to that of stress applied by the first insulating material to the semiconductor substrate.

10. The method according to claim 7, wherein the stress relaxation structure includes a trench formed in the one main surface of the semiconductor substrate and a third insulating material formed within the trench, and a gap is formed in the third insulating material.

11. The method according to claim 7, wherein the stress relaxation structure includes a trench that is formed in the one main surface of the semiconductor substrate and that includes a void therein.

* * * * *